United States Patent
Liao et al.

(10) Patent No.: US 12,439,643 B2
(45) Date of Patent: Oct. 7, 2025

(54) FIN SHAPE MODIFICATION

(71) Applicant: Taiwan Semiconductor Manufacturing Co., Ltd., Hsinchu (TW)

(72) Inventors: Ssu-Yu Liao, Hsinchu (TW); Ta-Wei Lin, Hsinchu (TW); Tsu-Hui Su, Taipei (TW); Chun-Hsiang Fan, Hsinchu (TW); Ming-Hsi Yeh, Hsinchu (TW); Kuo-Bin Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 447 days.

(21) Appl. No.: 17/879,638

(22) Filed: Aug. 2, 2022

(65) Prior Publication Data

US 2024/0047545 A1     Feb. 8, 2024

(51) Int. Cl.
*H10D 30/67* (2025.01)
*H01L 21/306* (2006.01)
*H10D 30/01* (2025.01)
*H10D 62/10* (2025.01)

(52) U.S. Cl.
CPC ....... *H10D 30/6735* (2025.01); *H01L 21/306* (2013.01); *H10D 30/021* (2025.01); *H10D 30/6757* (2025.01); *H10D 62/121* (2025.01)

(58) Field of Classification Search
CPC .. H10D 30/6735; H10D 30/62; H10D 30/797; H01L 21/306
USPC ........................................................ 257/401
See application file for complete search history.

(56) References Cited

U.S. PATENT DOCUMENTS

| | | |
|---|---|---|
| 2018/0182868 A1 | 6/2018 | Chan et al. |
| 2019/0035934 A1 | 1/2019 | Chung et al. |
| 2020/0027984 A1 | 1/2020 | Yeung et al. |
| 2020/0266195 A1* | 8/2020 | Cheng .................. H10D 84/853 |
| 2020/0312658 A1* | 10/2020 | Miura .................. H10D 84/017 |
| 2021/0391449 A1 | 12/2021 | Liao et al. |

FOREIGN PATENT DOCUMENTS

TW         202147520 A    12/2021

* cited by examiner

*Primary Examiner* — Quoc D Hoang
(74) *Attorney, Agent, or Firm* — Sterne, Kessler, Goldstein & Fox P.L.L.C.

(57) ABSTRACT

Fin and nanostructured channel structure formation techniques for three-dimensional transistors can tune device performance. For example, fin profile control can be achieved by modifying the shape of fins/nanostructured channel structures so as to reduce their line edge roughness. Consequently, current flow within the channel regions of fins and nanostructured channel structures can be improved, enhancing device performance.

20 Claims, 12 Drawing Sheets

//FIN SHAPE MODIFICATION

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments of the present disclosure, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

The term "vertical," as used herein, means perpendicular to the surface of a substrate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Various types of three-dimensional transistors can be constructed around a fin or a nanostructured channel structure as a structure to support current flow between doped regions of a semiconductor material. The disclosure herein describes fin and nanostructured channel structure formation, which can impact the performance of various types of three-dimensional (3-D) transistors, such as FinFETs and nanostructured devices.

Figure 1A:
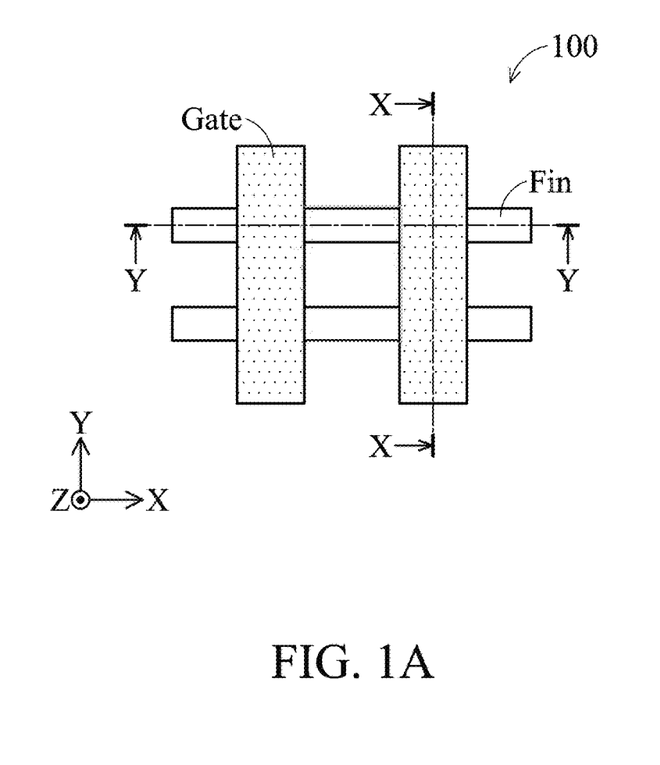
FIGS. 1A and 1B are top plan and isometric views, respectively, of three dimensional (3-D) FETs, in accordance with some embodiments of the present disclosure.
Figure 1B:
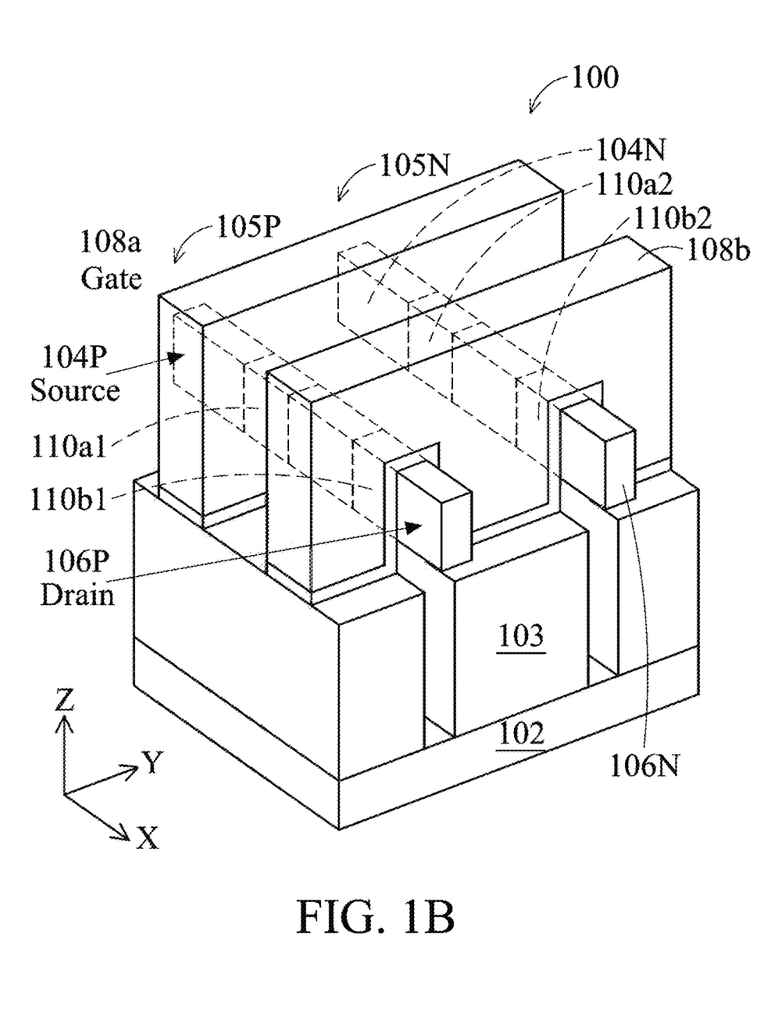

FIG. 1A shows a top plan view of 3-D FETs 100 (also referred to herein as "FETs 100"), respectively, in accordance with some embodiments. FETs 100 can be, for example, FinFETs, nanowire FETs, nanosheet FETs, or FETs having nanostructured channels, such as GAAFETs. FIG. 1B shows FETs 100 represented as FinFETs, according to some embodiments.

Referring to FIGS. 1A and 1B, FETs 100 are constructed on a substrate 102 with isolation regions 103 incorporated into substrate 102. As used herein, the term "substrate" describes a material onto which subsequent layers of material are added. Substrate 102 may be patterned. Materials added onto substrate 102 may be patterned or may remain unpatterned. Substrate 102 can be made of a semiconductor material, such as silicon (Si). Substrate 102 can be a bulk semiconductor wafer or the top semiconductor layer of a semiconductor-on-insulator (SOI) wafer (not shown), such as silicon-on-insulator. In some embodiments, substrate 102 can include a crystalline semiconductor layer with its top surface parallel to a crystal plane, e.g., one of (100), (110), (111), or c-(0001) crystal planes. In some embodiments, substrate 102 can be made from an electrically non-conductive material, such as glass, sapphire, and plastic. In some embodiments, substrate 102 can include (i) an elementary semiconductor, such as germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Substrate 102 can be doped with p-type dopants (e.g., boron (B), indium (In), aluminum (Al), or gallium (Ga)) or n-type dopants (e.g., phosphorus (P) or arsenic (As)). In some embodiments, different portions of substrate 102 can have opposite type dopants.

Each of FETs 100 shares a p-type fin 105P and an n-type fin 105N, respectively, each fin having source/drain regions 104P/106P and 104N/106N, respective gate structures 108a and 108b, and respective channels 110a1, 110a2, 110b1 and 110b2 Channels 110a1 and 110a2 are under adjacent gate structures 108a and 108b, respectively Channels 110b1 and 110b2 are under adjacent gate structures 108a and 108b, respectively. Thus, FETs 100 shown in FIGS. 1A and 1B are four transistors having shared source/drain regions and shared gates.

When a voltage applied to gate structure 108a exceeds a certain threshold voltage, FETs 100 controlled by gate structure 108a switches on and current flows through the channels 110a1 and 110a2, underlying the energized gate. When the applied voltage drops below the threshold voltage, FETs 100 shut off, and current ceases to flow through the associated channels.

Although only two fins and two gates are shown in FIGS. 1A and 1B, gate structures 108a and 108b may wrap around multiple fins arranged along the y-axis to form additional FETs 100. Likewise, separate regions of each fin may be controlled by additional gate structures spaced apart along the x-axis, to form additional FETs 100.

In some embodiments, gate structures 108a and 108b can include a gate electrode made of polysilicon. In some embodiments, the gate electrode can be made of metal, which can be fabricated by first forming a sacrificial polysilicon gate electrode, and later replacing the sacrificial polysilicon structure with a metal gate electrode.

Shallow trench isolation (STI) regions 103 are formed in substrate 102 to electrically isolate neighboring FETs 100 from one another. STI regions 103 can be formed adjacent to fins 105P and 105N. For example, an insulating material can be blanket deposited over and between each fin. The insulating material can be blanket deposited to fill trenches in substrate 102 (e.g., spaces that will be occupied by STI regions 103 in subsequent fabrication steps) surrounding fins 105. A subsequent polishing process, such as a chemical mechanical polishing (CMP) process, can substantially planarize top surfaces of STI regions 103. In some embodiments, the insulating material for STI regions 103 can include, for example, silicon oxide, silicon nitride, silicon oxynitride, fluoride-doped silicate glass (FSG), or a low-k dielectric material. In some embodiments, the insulating material for STI regions 103 can be deposited using a flowable chemical vapor deposition (FCVD) process, a high-density-plasma (HDP) CVD process, or silane (SiH4) and oxygen (O2) as reacting precursors. In some embodiments, the insulating material for STI regions 103 can be formed using a sub-atmospheric CVD (SACVD) process or high aspect-ratio process (HARP), where process gases can include tetraethoxysilane (TEOS) and/or ozone (O3). In some embodiments, the insulating material for STI regions 103 can be formed using a spin-on-dielectric (SOD), such as hydrogen silsesquioxane (HSQ) and methyl silsesquioxane (MSQ).

Figure 2:
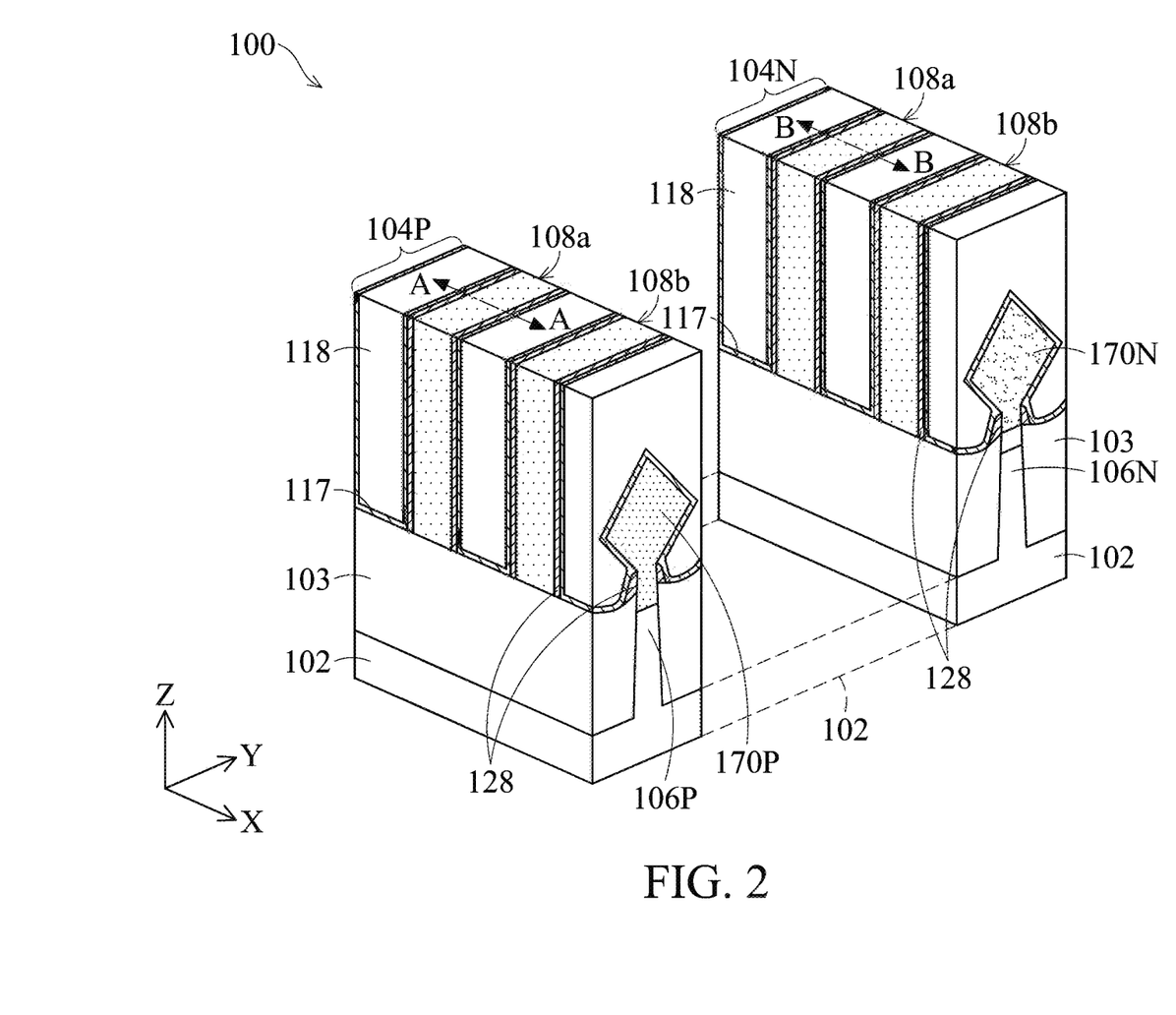
FIG. 2 is an isometric view of nanostructure transistors, in accordance with some embodiments of the present disclosure.

FIG. 2 shows FETs 100 represented as GAAFETs—n-type transistors (NFETs) 104N and p-type transistors (PFETs) 104P—according to some embodiments. The discussion of elements of NFET 104N and PFET 104P with the same annotations applies to each other, unless mentioned otherwise. In the examples shown in FIG. 2, NFET 104N and PFET 104P are GAAFETs with epitaxial source/drain regions 170N and 170P that have diamond or hexagonal shapes, which should not be interpreted as limiting. For example, alternative structures can include nanosheet GAAFETs having 2-D channels or nanowire GAAFETs having 1-D channels. GAAFETs 104N and 104P can include various spacers, e.g., inner spacers and sidewall spacers, made of dielectric materials that can be deposited using, for example, an ALD process. Such spacers are shown in FIG. 3.

Figure 3:
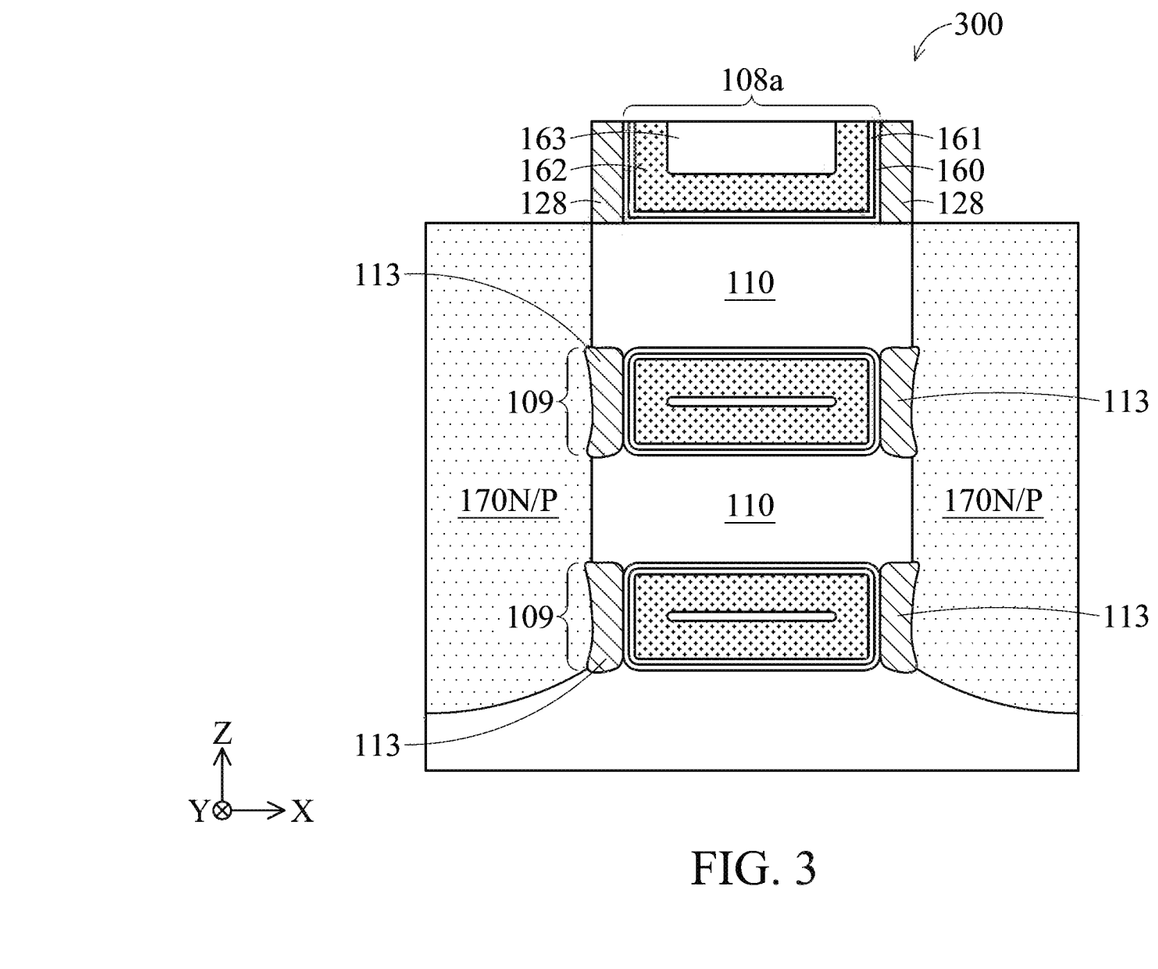
FIG. 3 is a magnified cross-sectional view of a nanostructured channel region along a cut line A-A of FIG. 2, in accordance with some embodiments of the present disclosure.

Referring to FIGS. 2 and 3, GAAFETs 104N and 104P include gate structures 108 that wrap around sides of one or more current-carrying channels 110. When a voltage applied to gate structure 108 exceeds a certain threshold voltage, GAAFETs 104N and 104P switch on and current flows through channels 110. When the applied voltage drops below the threshold voltage, GAAFETs 104N and 104P shut off and current ceases to flow through channels 110. Because the wrap-around arrangement of gate structure 108 influences channels 110 from its sides, improved control of the conduction properties of channels 110 is achieved in GAAFETs 104N and 104P compared with other transistor structures. In some embodiments, gate structure 108 in GAAFETs 104N and 104P can be made of polysilicon. In some embodiments, gate structure 108 can be made of metal, which can be fabricated by first forming a sacrificial polysilicon gate structure and later replacing the sacrificial polysilicon structure with a metal gate.

GAAFETs 104N and 104P are formed on substrate 102. In some embodiments, substrate 102 is common to multiple devices and/or a plurality of device types. Substrate 102 can include one or more of a wide array of semiconductor materials, such as silicon, germanium, gallium arsenide, and indium phosphide. Alternatively, substrate 102 can be made from an electrically non-conductive material, such as a glass wafer or a sapphire wafer. Substrate 102 can be patterned, for example, to form shallow trench isolation (STI) regions 103 in substrate 102 to electrically isolate neighboring GAAFETs from one another. In some embodiments of the present disclosure, the insulating material for STI regions 103 can include, for example, silicon dioxide ($SiO_2$), silicon nitride (SiN), silicon oxynitride (SiON), fluoride-doped silicate glass (FSG), or a low-k dielectric material. In some embodiments of the present disclosure, the insulating material for STI regions 103 can be deposited using a flowable chemical vapor deposition (FCVD) process, a high-density-plasma (HDP) CVD process, or a plasma enhanced (PE) CVD process.

FETs 100, when configured as a GAAFET shown in FIG. 2, can further include gate sidewall spacers 128, shallow trench isolation (STI) regions 103, etch stop layers (ESLs) 117, and interlayer dielectric (ILD) layers 118. ILD layer 118 can be disposed on ESL 117. ESL 117 can be configured to protect gate structures 108N and 108P and/or S/D regions 170N and 170P. In some embodiments, gate sidewall spacers 128, STI regions 103, ESLs 117, and ILD layers 118 can include an insulating material, such as silicon oxide, silicon nitride (SiN), silicon carbon nitride (SiCN), silicon oxycarbon nitride (SiOCN), and silicon germanium oxide.

FETs 100 can be formed on a substrate 102 with NFET 104N and PFET 104P formed on different regions of substrate 102. There may be other FETs and/or structures (e.g., isolation structures) formed between NFET 104N and PFET 104P on substrate 102, as described above. Substrate 102 can be doped with p-type dopants (e.g., boron, indium, aluminum, or gallium) or n-type dopants (e.g., phosphorus or arsenic). In some embodiments, fin structures 106N-106P can include a material similar to substrate 102 and extend along an X-axis.

Referring to FIG. 2, NFET-PFET 104N-104P can include stacks of nanostructured channels 110, gate structures 108N-108P, S/D regions 170N-170P, and S/D contact structures 120N-120P disposed on S/D regions 170N-170P.

Referring to FIGS. 2 and 3, NFET 104N can include an array of gate structures 108N disposed on fin structure 106N, and PFET 104P can include an array of gate structures 108P disposed on fin structure 106P. NFET 104N can further include stacks of nanostructured channels 110 surrounded by gate structures 108N and an array of S/D regions 170N (one of S/D regions 170N shown in FIG. 2) disposed on portions of fin structure 106N that are not covered by gate structures 108N. Similarly, PFET 104P can further include stacks of nanostructured channels 110 surrounded by gate structures 108P and an array of epitaxial S/D regions 170P (one of S/D regions 170P shown in FIG. 3) disposed on portions of fin structure 106P that are not covered by gate structures 108P. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm.

FIG. 3 is a magnified cross-sectional view of FET 100 along cut line A-A, corresponding to the p-type GAAFET 104P of FIG. 2. FIG. 3 could also represent a magnified cross-sectional view along cut line B-B, corresponding to the n-type GAAFET 104N of FIG. 2. Cut lines A-A and B-B cut across the source, gate, and drain regions of GAAFETs 104N and 104P. FIG. 3 shows a GAA nanostructured channel region 300 following a replacement metal gate process, in which gate structure 108a is formed together with gate-all-around structures 109, according to some embodiments. FIG. 3 shows details of an internal structure of the GAAFETs 104N and 104P under gate structure 108a, including channels 110, gate sidewall spacers 128, and inner spacers 113. One or more of spacers 113 and 128 can be made of dielectric materials deposited using ALD.

In the replacement metal gate process, a sacrificial structure (not shown), e.g., a poly gate structure, can be removed using a dry etching process (e.g., plasma etching or reactive ion etching (RIE)) or a wet etching process. In some embodiments, gas etchants used in the dry etching process can include chlorine, fluorine, bromine (e.g., hydrogen bromide (HBr), oxygen (e.g., $O_2$ or $O_3$), or combinations thereof. In some embodiments, an ammonium hydroxide ($NH_4OH$), sodium hydroxide (NaOH), and/or potassium hydroxide (KOH) wet etch can be used to remove the polysilicon sacrificial structures, or a dry etch followed by a wet etch process can be used.

Gate structure 108a is then grown in a multi-operation process to form a metal gate stack in place of the sacrificial structure. Simultaneously, a radial gate stack is formed to fill gate openings in the GAA channel region from the outside in, starting with gate dielectric layer 160, and ending with gate electrode 163. Following the replacement metal gate process, the GAA channel region includes multiple GAA structures 109 (two shown in FIG. 3), which surround channels 110 to control current flow therein. Gate structure 108 has a width equal to the gate length L g of the GAAFET. In some embodiments, L g can be in the range of about 5 nm to about 20 nm.

Referring to the magnified view of the GAA channel region shown in FIG. 3, each GAA channel region includes, from the outermost layer to the innermost layer, a bi-layer gate dielectric 160-161, a work function metal layer 162, and a gate electrode 163. Gate electrode 163 is operable to maintain a capacitive applied voltage across nanostructured channels 110. Inner spacers 113 electrically isolate GAA structure 108 from epitaxial source/drain regions 170N/170P and prevent current from leaking out of nanostructured channels 110. In some embodiments, inner spacers 113 can have a width from about 2 nm to about 8 nm. In some embodiments, GAA structures 109 can have a thickness from about 3 nm to about 15 nm. The bi-layer gate dielectric 160-161 separates metallic layers of GAA structure 109 from nanostructured channels 110. In some embodiments, an ALD process can be used to deposit one or more of radial gate stack layers 160-163.

The bi-layer gate dielectric may include a gate oxide inter-layer 160 and a high-k gate dielectric layer 161. In some embodiments, the bi-layer gate dielectric can have a total thickness between about 1 nm and about 5 nm. Gate oxide inter-layer 160 can include a silicon oxide, silicon nitride, and/or silicon oxynitride material, and may be formed by CVD, ALD, physical vapor deposition (PVD), e-beam evaporation, or other suitable deposition processes. High-k gate dielectric layer 161 includes a high-k material, where the term "high-k" refers to a high dielectric constant that exceeds the dielectric constant of Sift (e.g., greater than 3.9). In some embodiments, the high-k dielectric material can be hafnium oxide ($HfO_2$). A high-k gate dielectric may be formed by ALD and/or other deposition methods.

Gate work function metal layer 162 can include a single metal layer or a stack of metal layers. The stack of metal layers can include metals having work functions similar to or different from each other. In some embodiments, gate work function metal layer 162 can include, for example, aluminum (Al), copper (Cu), tungsten (W), titanium (Ti), tantalum (Ta), cobalt (Co), metal nitrides, metal silicides, metal alloys, and/or combinations thereof. In some embodiments, gate work function metal layer 162 can be a bi-layer of titanium nitride (TiN) and a titanium-aluminum (TiAl) alloy. The gate work function metal layer can be formed using a suitable process, such as ALD, CVD, PVD, plating, and combinations thereof. In some embodiments, the gate work function metal layer can have a thickness between about 2 nm and about 15 nm.

Gate electrode 163 may further include a gate metal fill layer. The gate metal fill layer can include a single metal layer or a stack of metal layers. The stack of metal layers can include metals different from each other. In some embodiments, the gate metal fill layer can include one or more suitable conductive materials or alloys, such as Ti, Al, and TiN. The gate metal fill layer can be formed by ALD, PVD, CVD, or other suitable deposition process. Other materials, dimensions, and formation methods for the gate dielectrics 160-161, the gate work function metal layer 162, and the gate electrode 163 are within the scope and spirit of this disclosure.

Figure 4A:
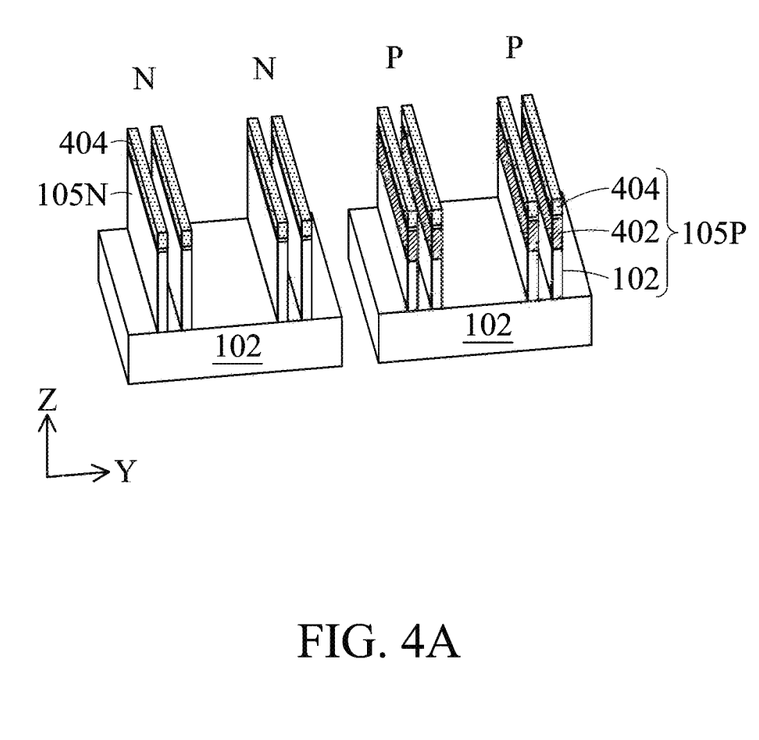
FIGS. 4A and 4B are isometric views of fins/nanostructured channels, in accordance with some embodiments of the present disclosure.
Figure 4B:
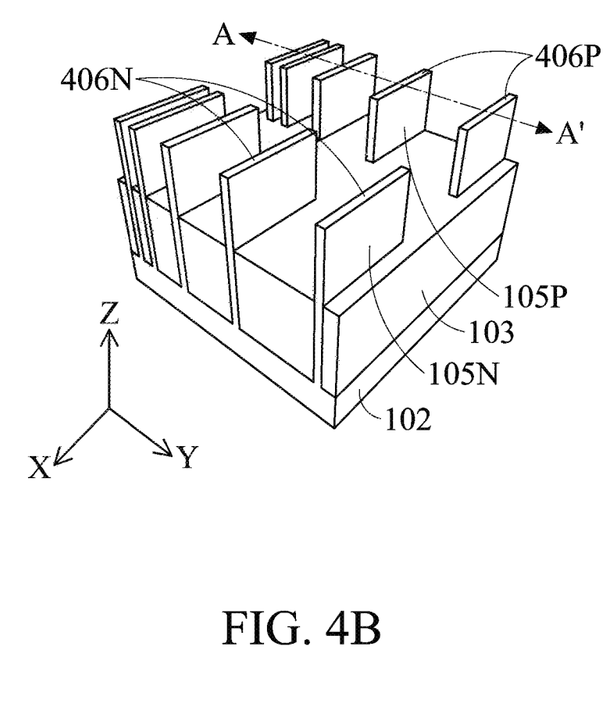

FIGS. 4A and 4B illustrate n-type fins 105N and p-type fins 105P formed from substrate 102, according to some embodiments. A description of the structures is given here, while details of the fabrication process for n-type fins 105N and p-type fins 105P are explained below with reference to FIGS. 9-13. Referring to FIG. 4A, in designated regions of substrate 102, a top layer of silicon substrate 102 can be replaced with a silicon germanium (SiGe) layer 402 to create a SiGe fin, or SiGe structure. SiGe layer 402 can be formed, for example, using an epitaxial growth process that allows p-type dopants to be incorporated in-situ. In other regions, substrate 102 can be implanted with n-type dopants. In some embodiments, the two doping processes—epitaxial and implant—can be conducted sequentially, in either order, while masking the region that is not being treated. In some embodiments, the SiGe thickness is between about 5 nm and about 100 nm, and the germanium component makes up between about 5% and about 50% of SiGe layer 402.

Referring to FIGS. 4A and 4B, after the doping processes are completed, both the n-type regions and the p-type regions of substrate 102 can be patterned and then etched to form n-type fins 105N and p-type fins 105P. In some embodiments, a hard mask 404 is made by depositing a silicon nitride (SiN) layer and patterning the SiN layer using a photoresist mask. In some embodiments, n-type fins 105N are made of silicon, while p-type fins have top portions made of silicon and bottom portions made of SiGe.

Following removal of hard mask 404, isolation regions 103 can be formed by flowing or depositing an insulating material, e.g., oxide, around bottom portions of fins 105N and 105P so that top portions of fins 105N and 105P protrude above the surface of isolation regions 103. In some embodiments, top surfaces 406N and 406P of fins 105N and 105P, respectively, as seen from above, have substantially straight edges that are aligned with one another as shown in FIG. 4B. A cross-sectional view of desirable p-type fins 105P, along cut line A-A' shown in FIG. 4B, is shown in FIG. 5D.

Figure 5A:
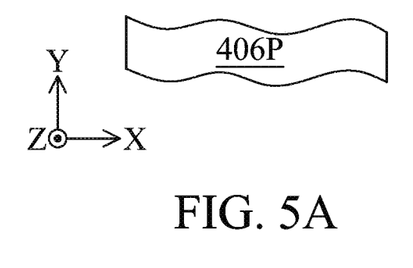
FIGS. 5A and 5B are top plan and cross-sectional views of a fin with non-ideal line edge roughness, in accordance with some embodiments of the present disclosure.
Figure 5B:
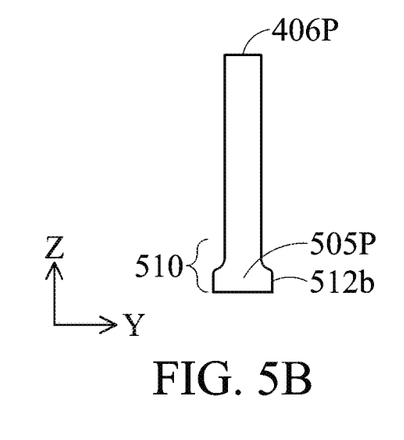

FIGS. 5A and 5B illustrate magnified views of a non-ideal top surface 406P of the SiGe top portion of a p-type fin 505P, according to some embodiments. Unlike the ideal representations shown in FIGS. 4A and 4B, top surface 406P of p-type fin 505P has wavy edges 508 instead of substantially straight edges. The variation of wavy edges 508, or "fin wiggle" is quantified as a line edge roughness. An ideal straight-edged top surface has zero line edge roughness, according to some embodiments.

FIGS. 5A-5D illustrate a relationship between the line edge roughness of the top edge of fin 505P and the shape of a base 510 of p-type fin 505P, according to some embodiments. FIGS. 5A and 5B show that when base 510 of p-type fin 505P is not significantly wider than the fin itself and has a substantially vertical profile 512b, the corresponding fin top surface 406P of p-type fin 505P exhibits wavy edges 508 corresponding to a high line edge roughness—e.g., a line edge roughness in the range of about 1.5 nm to about 3.5 nm.

Figure 5C:
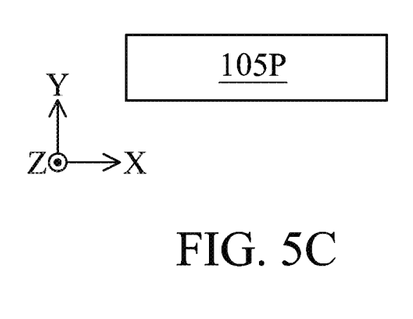
FIGS. 5C and 5D are top plan and cross-sectional views of a fin with ideal line edge roughness, in accordance with some embodiments of the present disclosure.
Figure 5D:
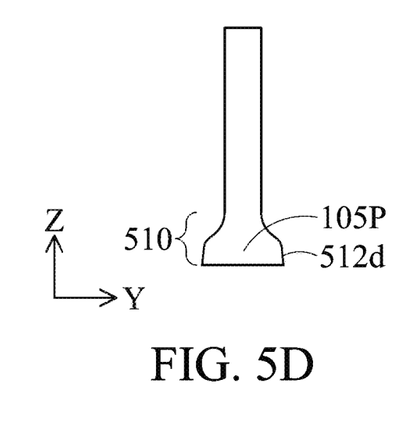

In contrast, FIGS. 5C and 5D show that when base 510 of a p-type fin is significantly wider than the fin itself and has a sloped profile 512d, the corresponding top surface of the fin has substantially straight edges (e.g., corresponding to a zero line edge roughness).

Figure 6:
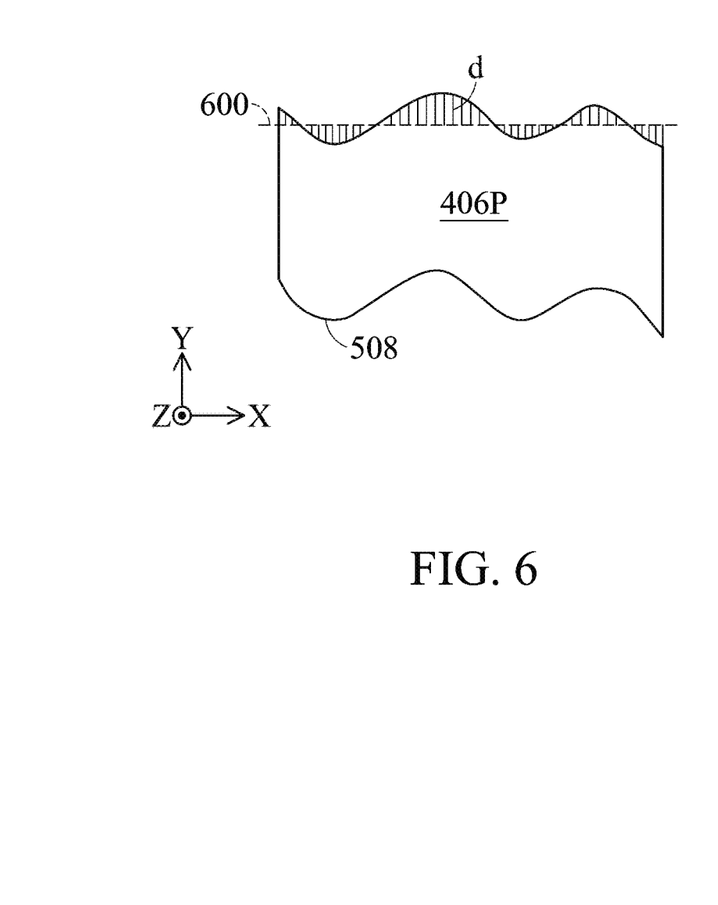
FIG. 6 is a top plan view of a fin with line edge roughness, in accordance with some embodiments of the present disclosure.

With reference to FIG. 6, the variation of wavy edges 508 can be further quantified by computing a statistical line edge roughness characterizing a portion of the fin length, or the entire fin. First, a series of deviations d relative to a straight edge 600 can be measured to generate a data set including d1, d2, d3, and so on. Some values of d, such as the examples shown in FIG. 6, are above straight edge 600 and have positive values; other values of d are below straight edge 600 and have negative values. A statistical value representing the data set as a whole can be calculated as an overall line edge roughness, such as the average of the absolute values of d or the root mean square (RMS) deviation. Thus, the overall, or average, variation of wavy edges 508 can be represented by a single value referred to as the line edge roughness, which can be measured in nanometers.

In some embodiments, line edge roughness correlates with increased channel resistance in channels 110 in FIGS. 1B and 2. Channel resistance tends to degrade device performance by impeding current flow through channels 110. In some embodiments, device performance metrics that can be affected by line edge roughness include those that relate to current flow through a wavy channel such as, for example, threshold voltage Vth, channel resistance, leakage current that flows in the off-state (Ioff), and, ultimately, FET switching speed. In addition, it has been observed that the line edge roughness further correlates with certain defects (e.g., surface particles), such as residue defects found between p-type fins. In some embodiments, unlike p-type fins 105P, n-type fins 105N are not characterized by wavy edges 508. Thus, a significant line edge roughness and associated performance degradation and defects can be characteristic of p-type fins 105P (e.g., that include SiGe layer 402), according to some embodiments. The cause of line edge roughness can be related to the presence of different atoms (e.g., germanium atoms) in the silicon lattice, which distort the geometry of the p-type fins and thus result in wavy profiles, according to some embodiments. Since the n-type fins may not include SiGe to disturb the silicon lattice, n-type fins can have a lower line edge roughness than p-type fins.

Figure 7:
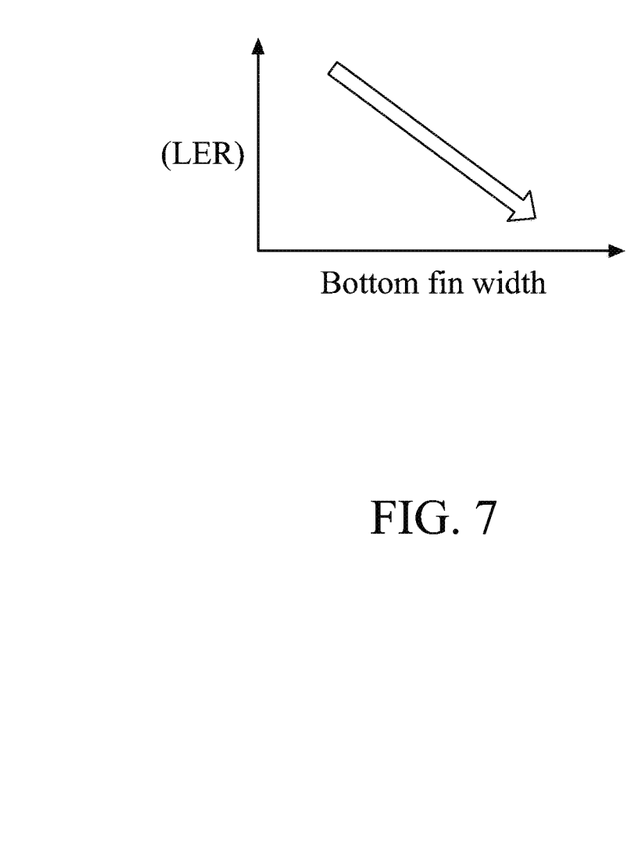
FIG. 7 is a plot of line edge roughness as a function of bottom fin width, in accordance with some embodiments of the present disclosure.

FIG. 7 illustrates the relationship between the bottom fin width of base 510 of p-type fin 505P and line edge roughness values, characterizing the waviness of the fin top surface 406P, according to some embodiments. FIG. 7 shows that, as the bottom fin width increases, the line edge roughness decreases linearly, with a slope of about −1. The linear relationship provides guidance to fabricate the shape of base 510 so as to produce straight-edged fins. In some embodiments, such a relationship does not characterize edges of fin top surface 406N of the n-type fin 105N.

Figure 8A:
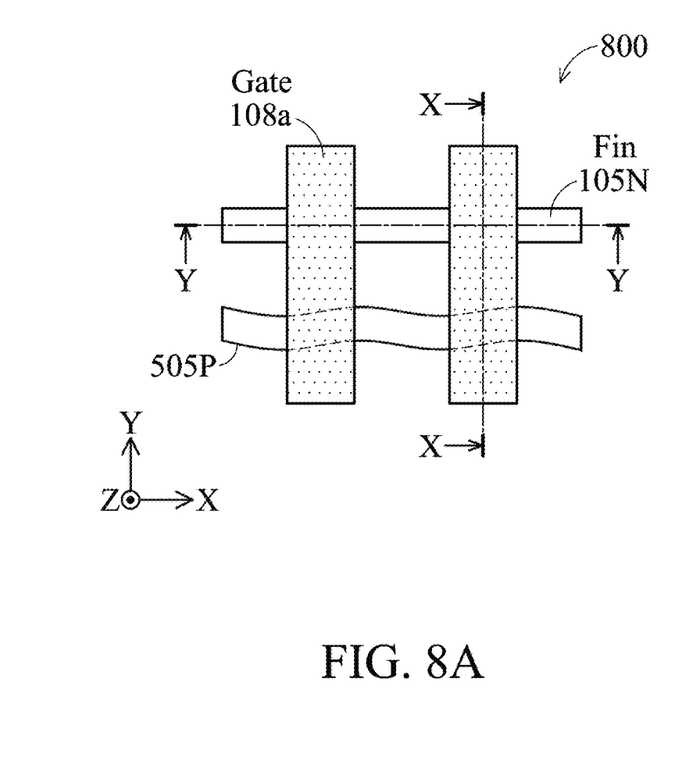
FIGS. 8A and 8B are top plan and isometric views, respectively, of 3-D FETs, in accordance with some embodiments of the present disclosure.
Figure 8B:
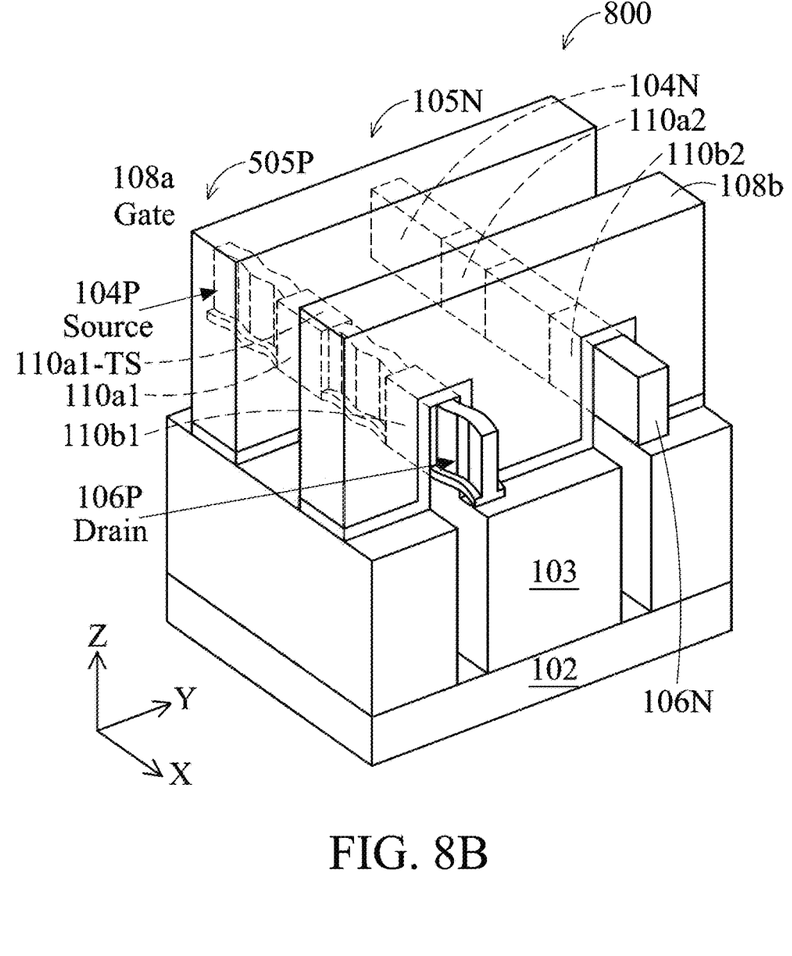

FIGS. 8A and 8B illustrate, for comparison with FIGS. 1A and 1B, a FET 800 including p-type fin 505P having wavy edges and a high line edge roughness, adjacent to a corresponding n-type fin 105N that has a substantially straight fin top and a substantially zero line edge roughness. FIG. 8B shows channel 110a1 of p-type fin 505P having a top surface 110a1-TS and a bottom surface (e.g., opposite the top surface) bordering STI 103. Fin 505P, including the portion under gate 108a, has a bottom portion below the surface of STI 103 and a top portion that extends out vertically (e.g., in the z-direction) from the surface of STI 103. Channel 110a-1 is the top portion of the fin that is under gate 108a; a channel structure includes the channel 110a-1 as well as a bottom portion of the fin under channel 110a-1. When FET 800 is configured as a GAAFET, channel 110a-1 is a nanostructured channel region containing multiple stacked channels. A nanostructured channel structure includes both nanostructured channel 110a-1 and its corresponding bottom portion below the surface of STI 103.

Figure 9:
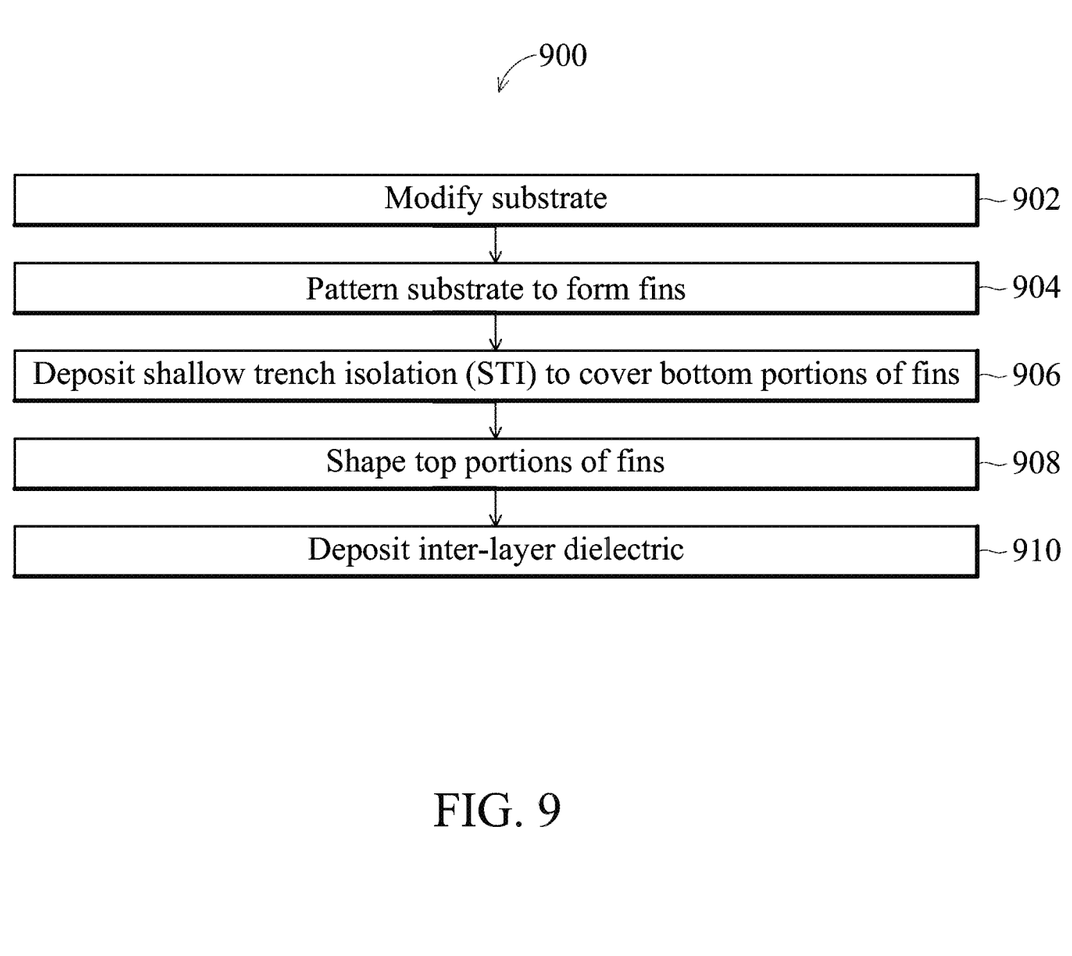
FIG. 9 is a flow diagram of a method for fabricating fins with controlled profiles, in accordance with some embodiments of the present disclosure.

FIG. 9 is a flow diagram showing operations in a method 900 of forming fins having substantially straight edges, according to some embodiments. For illustrative purposes, operations shown in FIG. 9 will be described with reference to processes for fabricating SiGe p-type fins as illustrated in FIGS. 10A, 10B, 10C, 11A, 11B, 12A, 12B, and 13, which are cross-sectional views of fins at various stages of their fabrication, according to some embodiments. Operations of method 900 can be performed in a different order, or not performed, depending on specific applications. It is noted that method 900 may not produce complete fins 105P. Accordingly, it is understood that additional processes can be provided before, during, or after method 900, and that some of these additional processes may be briefly described herein.

Further, based on the description herein, method 900 can be used to fabricate other types of fins, which are within the scope of the present disclosure. Method 900 can also be used in the fabrication of fin structures that used in the manufacturing of FinFET and nanostructured transistors (e.g., nanowire FETs, nanosheet FETs, and GAAFETs), such as the transistors shown in FIGS. 1B and 2.

Figure 10A:
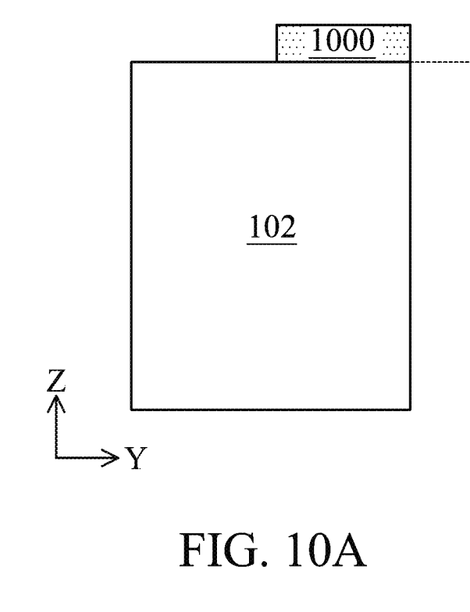
FIGS. 10A-10C, 11A, 11B, 12A, 12B, and 13 are isometric and cross-sectional views of the fins shown in FIGS. 5C-5D at various stages of their fabrication process, in accordance with some embodiments of the present disclosure.
Figure 10B:
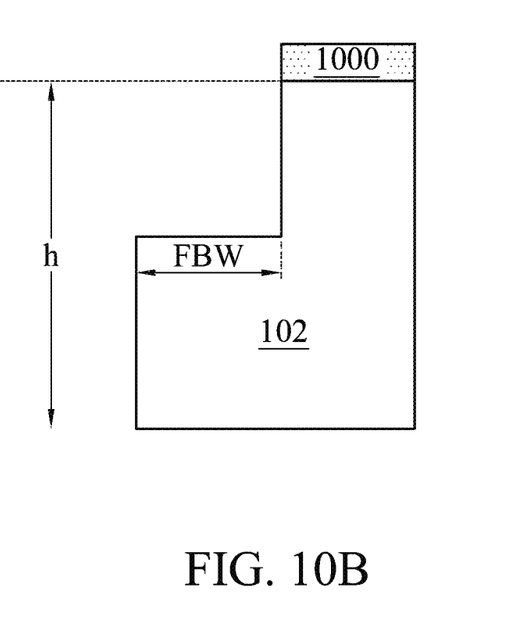
Figure 10C:
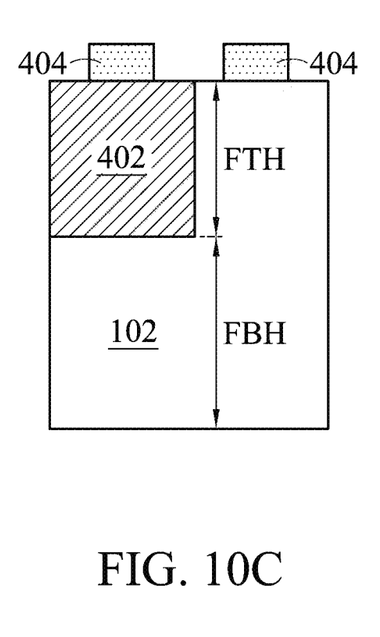

Referring to FIG. 9, in operation 902, substrate 102 is modified as shown in FIGS. 10A-10C, according to some embodiments. Substrate 102 can be doped n-type, or supplied with n-type dopants, e.g., arsenic or phosphorous, already present in the silicon. A region of substrate 102 where n-type fins 105N will be formed can be blocked using a mask 1000, as shown in FIG. 10A. Mask 1000 can be a photoresist mask or a hard mask made of, e.g., silicon nitride or another suitable material. In unmasked regions of substrate 102, a portion of the silicon can be etched away as shown in FIG. 10B, leaving a silicon base that will serve as a bottom portion of p-type fins 105P. In some embodiments, the fin bottom height is in the range of about 30 nm to about 100 nm.

Etching, as referred to herein, can include a dry etch process, a wet etch process, or a combination thereof. In some embodiments, the dry etch process can include using a plasma dry etch using a gas mixture that includes, for example, octafluorocyclobutane ($C_4F_8$), argon (Ar), oxygen ($O_2$), helium (He), fluoroform ($CHF_3$), carbon tetrafluoride ($CF_4$), difluoromethane ($CH_2F_2$), chlorine ($Cl_2$), hydrogen bromide (HBr), or a combination thereof with a pressure ranging from about 1 mTorr to about 500 mTorr. In some embodiments, the wet etch process can include using a diluted hydrofluoric acid (DHF) treatment, an ammonium peroxide mixture (APM), a sulfuric peroxide mixture (SPM), hot deionized water (DI water), tetramethylammonium hydroxide (TMAH), or a combination thereof. In some embodiments, the etching process can selectively remove a first material from a second material. Based on the disclosure herein, other gas species or chemicals for the etching process are within the scope and spirit of this disclosure.

In some embodiments, the etching process can be anisotropic e.g., a plasma etch chemistry suitable for etching silicon (e.g., poly-crystalline silicon, or polysilicon) that is fluorine or chlorine-based. In some embodiments, a wet etch chemistry can be used such as a hydrofluoric acid-based or a nitric acid-based chemistry. Referring to FIG. 10B, with mask 1000 still in place, epitaxial layer 402 can be grown on exposed regions of substrate 102 to replace the silicon that was removed. In some embodiments, epitaxial layer 402 is made of SiGe and can be doped in-situ with one or more p-type dopants, such as boron. Following formation of epitaxial layer 402, mask 1000 can be removed.

Figure 11A:
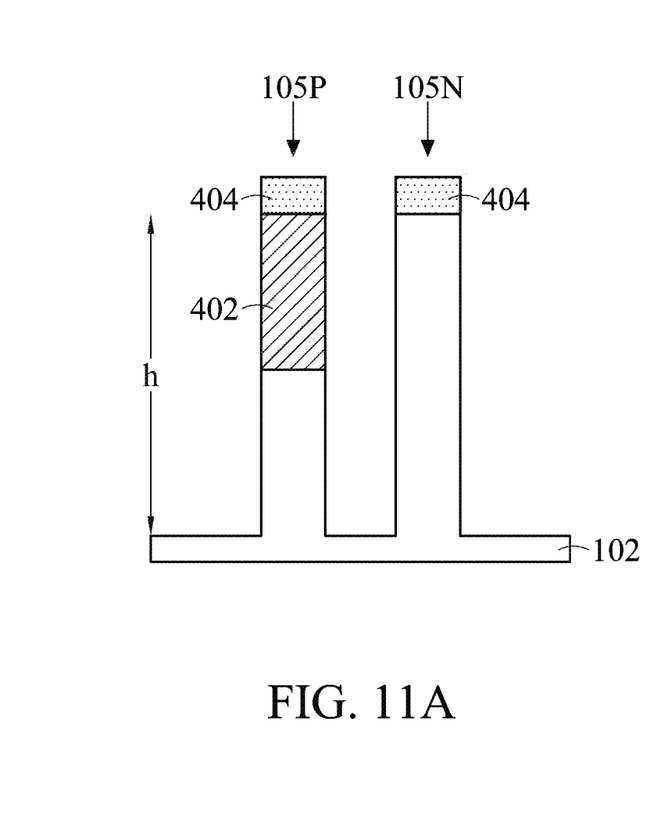

Referring to FIG. 9, in operation 904, substrate 102 and epitaxial layer 402 are patterned to form fins 105P and 105N, as shown in FIGS. 10C and 11A, according to some embodiments. Substrate 102 and epitaxial layer 402 can be patterned with hard mask 404, or, alternatively, with a photoresist mask, and then etched to form fins 105P and 105N having a total fin height h in the range of about 35 nm to 200 nm and a fin bottom width FBW of up to about 80 nm. In some embodiments, fins 105P have a fin bottom height FBH (of silicon) in the range of about 30 nm to about 100 nm. In some embodiments, fins 105P have a fin top height FTH (e.g., of SiGe) in the range of about 5 nm to about 100 nm. In some embodiments, a ratio of FTH:h can range from about 0.025 to about 2.86; a ratio of FBH:h can range from about 0.15 to about 2.86; and a ratio of FTH:FBH can range from about 0.05 to about 3.33.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, mask 404 has features for blocking fin regions while unblocked portions of substrate 102 are etched away. A distance between corresponding features of adjacent fins, known as the pitch, is in the range of about 5 nm to about 1 μm.

Following the etching process, mask 404 can be retained on top of p-type fins 105P made of SiGe on silicon, and on top of n-type fins 105N made of silicon, for example.

Figure 11B:
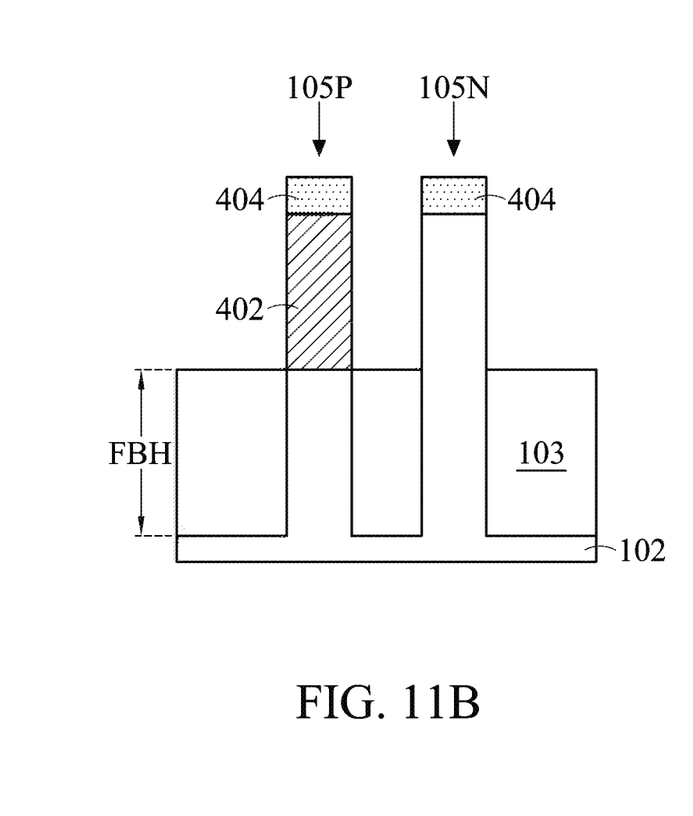

Referring to FIG. 9, in operation 906, STI regions 103 can be formed to cover bottom portions of fins 105P and 105N, as shown in FIG. 11B, according to some embodiments. In some embodiments, the height of STI regions 103 approximately matches the fin bottom height FBH, in the range of about 30 nm to about 100 nm. In some embodiments, STI regions 103 are formed from a flowable material, e.g., a flowable oxide, that fills spaces in and around fins 105N and 105P, up to a prescribed level that covers about half of the height if fins 105P and 105N. In some embodiments, STI regions 103 can be deposited by a CVD process over fins 105P and 105N, and then etched back to the prescribed level using an etchant that removes oxide anisotropically, e.g., a plasma etch process.

Figure 12A:
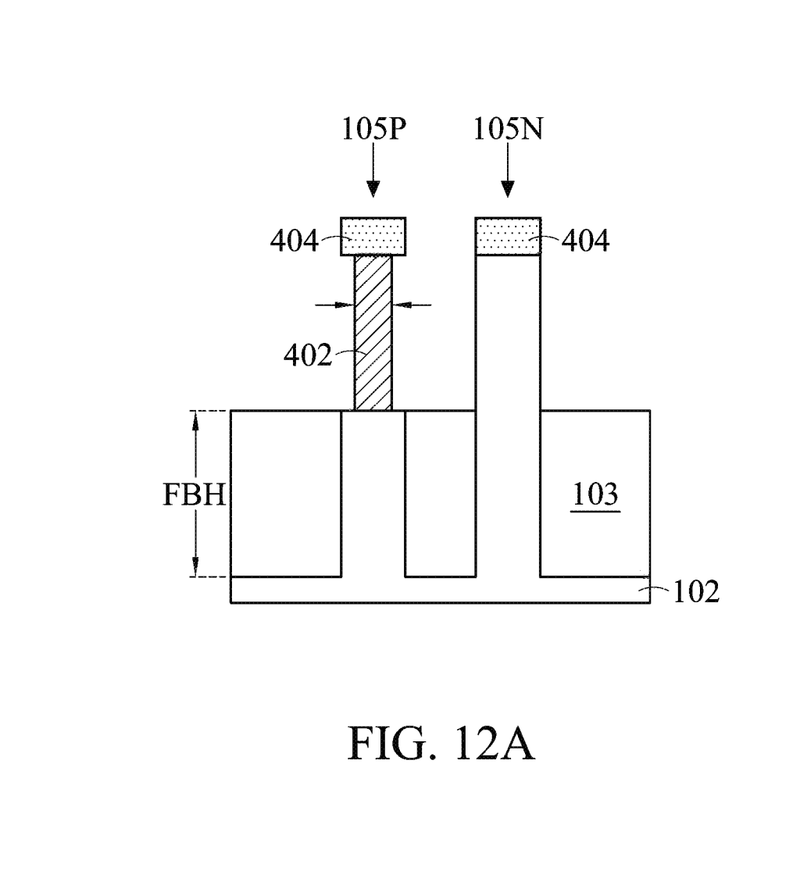
Figure 13:
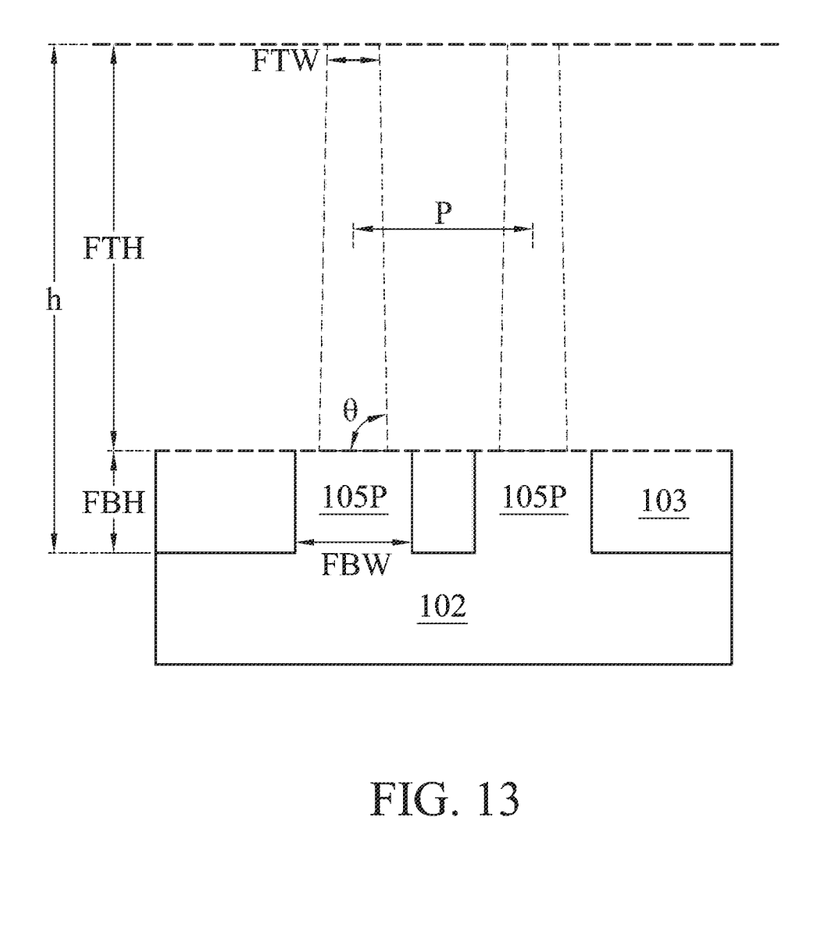

Referring to FIG. 9, in operation 908, SiGe can be recessed to shape top portions of fins 105P, as shown in FIG. 12A, according to some embodiments. Top portions of fins 105P, which are made of SiGe and which protrude above STI regions 103, can be recessed laterally, relative to bottom portions of fins 105P, which are surrounded by STI regions 103. A lateral recess of top portions of fins 105P can be performed by exposing the fins to an etchant to etch SiGe isotropically, from the sides, relative to silicon, while the tops of fins 105P and 105N are still covered by mask 404, so that fin heights are not eroded by the etchant Following the recess etch, mask 404 can be removed. In some embodiments, the recess etch can cause top portions of fins 105P to be tapered such that the top width of fin 105P is narrower than the bottom width, as shown in FIG. 13. In some embodiments, a fin top width FTW of the recessed fin 105P can be in a range of about 2 nm to about nm and a fin bottom width FBW of the recessed fin 105P can be up to about 80 nm wide. Thus, in some embodiments, the bottom width of fin 105P can exceed the fin top width by a factor of at least 80/50, or 1.6 (FBW/FTW=1.6). In some embodiments, the bottom width of fin 105P exceeds the fin top width by a factor of 80/2, or 40 (FBW/FTW=40), to limit the line edge roughness of the fin. For every 5 Å that FBW exceeds FTW, the LER can be reduced by about 1 Å to about 5 Å, with a commensurate reduction in channel resistance. Sidewall profiles of fins 105P can be characterized by a taper angle θ as shown in FIG. 13. In some embodiments, values of taper angle θ can have a range of about 60 degrees to 90 degrees.

Figure 12B:
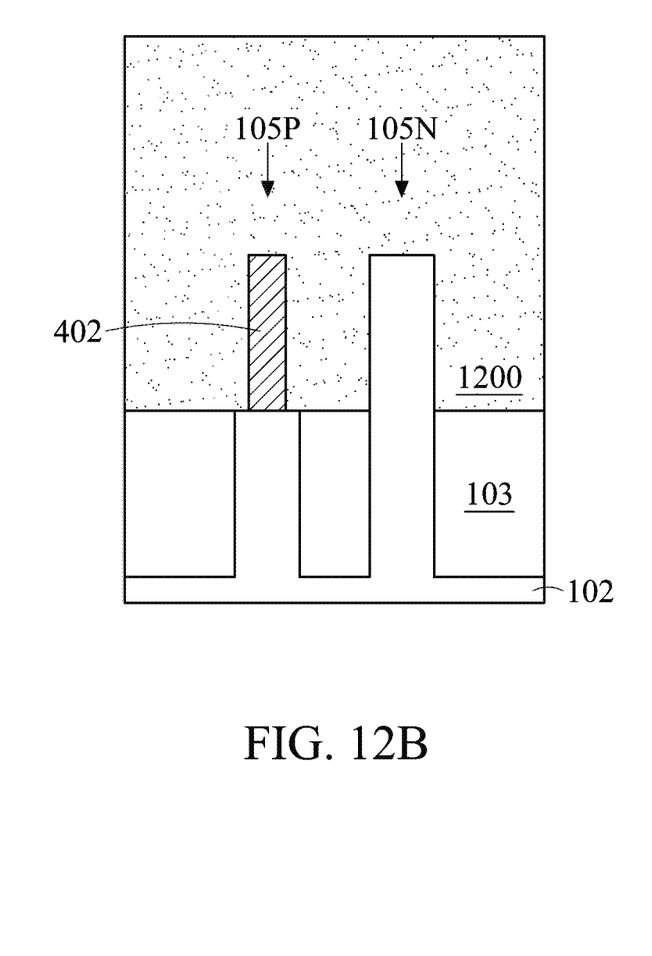

Referring to FIG. 9, in operation 910, an inter-layer dielectric (ILD) 1200 is deposited as shown in FIG. 12B, according to some embodiments. ILD 1200 may include silicon dioxide or a low-k dielectric material such as, for example, a fluorosilicate glass, a carbon-doped silicon dioxide, a porous silicon dioxide, a porous carbon-doped silicon dioxide, a hydrogen silsesquioxane, a methylsilsesquioxane, a polyimide, a polynorbomene, a benzocyclobutene and/or a polytetrafluoroethylene. For forming the interlayer dielectric, a deposition process such as, for example, chemical vapor deposition, plasma-enhanced chemical vapor deposition and/or spin coating can be performed.

In some embodiments, ILD 1200 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). A flowable ILD can be deposited using a flowable CVD deposition process (FCVD). Other materials and formation methods for ILD 1200 are within the scope and spirit of this disclosure.

Referring to FIG. 13, the definitions of various dimensions for adjacent p-type fins 105P are summarized after formation according to method 900. FIG. 13 highlights features of the dual width profiles characterizing p-type fins 105P, in which p-type fin 105P has a bottom portion with a width different from that of its top portion, in contrast with a substantially uniform width for n-type fins 105N, according to some embodiments. Such features include the fin bottom width (FBW), fin top width (FTW), pitch (P), fin top height (FTH), fin bottom height (FBH), taper angle θ, and fin total height h. In some embodiments, a ratio of FTW:FBW can range from about 0.025 to about 1.0, with the upper bound being limited by the requirement that FTW not exceed FBW so that the base is larger than the top. In some embodiments, a ratio of fin height h to the height of STI 103 can range from about 0.05 to about 3.33.

The center-to-center distance between fins, or pitch, determines the amount that the base of the fins can be widened to prevent line edge roughness, according to some embodiments. For narrow pitch devices having a pitch of e.g., 5 nm, FBW can be less than the pitch to maintain separation between the bases of the fins. For wider pitch devices (e.g., fins having a pitch of 1 micron, or 1000 nm), a fin bottom width of less than 80 nm is more than ten times smaller than the pitch.

By following the process outlined in method 900, fin profile control can be achieved by modifying the shape of p-type fins so as to reduce their line edge roughness and to create fins having dual width (e.g., tapered profiles shown in FIG. 13). Consequently, current flow within the channel regions of the p-type fins can be improved, enhancing device performance, and defect modes that result from wavy edges can be significantly reduced or eliminated.

In some embodiments, a method includes: forming, on a substrate, a fin having a bottom portion with a bottom surface and a top portion with top portion, where a ratio of a fin width at the bottom surface to a fin width at the top surface is between about 1.6 and about 40; depositing an insulating material to cover the bottom portion of the fin; tapering the top portion of the fin using an etching process; forming a gate around the top portion of the fin; and forming source/drain regions adjacent to the gate.

In some embodiments, a method includes: forming a silicon germanium (SiGe) structure on a silicon substrate, where the SiGe structure includes source and drain regions; forming a nanostructured channel region between the source and drain regions, where the SiGe structure has a fin top width and a fin bottom width that exceeds the fin top width by a factor of at least 1.6; and forming a gate structure around the nanostructured channel region.

In some embodiments, a structure includes: a substrate; a nanostructured channel structure on the substrate, the nanostructured channel structure having a bottom portion with a bottom surface and a top portion with a top surface, where a plurality of nanostructured channels are formed in the top portion and where a width of the top surface is between about 1.6 and about 40 times narrower than a width of the bottom surface; a gate surrounding the top portion of the nanostructured channel structure; source/drain regions adjacent to the gate; and an insulator covering the bottom portion of the nanostructured channel structure.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming, on a substrate, a first fin having a bottom portion and a top portion;
    forming, on the substrate and adjacent to the first fin, a second fin having a bottom portion and a top portion;
    depositing an insulating material to cover the bottom portion of the first fin and the bottom portion of the second fin;
    isotropically etching the top portion of the first fin laterally using an etching process while a width of the top portion of the second fin remains substantially constant;
    forming a gate around the top portion of the first fin and the top portion of the second fin; and
    forming source/drain regions adjacent to the gate.

2. The method of claim 1, further comprising forming a stack of nanostructured channels in a channel region below the gate.

3. The method of claim 1, wherein forming the source/drain regions comprises:
    recessing regions of the top portion of the first fin uncovered by the gate; and
    epitaxially growing the source/drain regions in the recessed regions.

4. The method of claim 1, wherein forming the first fin comprises forming the top and bottom portions of the first fin with different materials.

5. The method of claim 1, wherein forming the first fin comprises:
   forming the bottom portion of the first fin with silicon; and
   forming the top portion of the first fin with silicon germanium (SiGe).

6. The method of claim 1, wherein forming the first fin comprises etching the bottom and top portions of the first fin using different etching operations.

7. The method of claim 1, wherein etching the top portion of the first fin comprises etching the top portion at an angle formed between a top surface of the insulating material and a sidewall of the first fin, and wherein the angle is between about 60 degrees and about 90 degrees.

8. A method, comprising:
   forming a silicon germanium (SiGe) structure on a silicon substrate, the SiGe structure comprising source and drain regions;
   forming a nanostructured channel region between the source and drain regions, the SiGe structure forming a first fin having a fin top portion and a fin bottom portion;
   forming, on the silicon substrate and adjacent to the SiGe structure, a second fin having a top portion and a bottom portion;
   isotropically etching the fin top portion of the SiGe structure laterally using an etching process while a width of the top portion of the second fin remains substantially constant; and
   forming a gate structure around the nanostructured channel region.

9. The method of claim 8, wherein forming the SiGe structure comprises forming p-type doped source and drain regions.

10. The method of claim 8, wherein forming the SiGe structure comprises forming a top portion of the SiGe structure having substantially straight edges along a length of the SiGe structure.

11. The method of claim 8, wherein forming SiGe structure comprises forming the SiGe structure with sidewalls that are tapered at an angle between about 60 degrees and 90 degrees.

12. A method, comprising:
   forming, on a substrate, a first fin having a bottom portion and a top portion;
   forming, on the substrate and adjacent to the first fin, a second fin having a bottom portion and a top portion;
   depositing an insulating material to cover the bottom portion of the first fin and the bottom portion of the second fin;
   recessing laterally the top portion of the first fin using an etching process while a width of the top portion of the second fin remains substantially constant;
   forming a gate around the top portion of the first fin and the top portion of the second fin; and
   forming source/drain regions adjacent to the gate.

13. The method of claim 12, wherein a ratio of a first fin width at a bottom surface to a first fin width at a top surface is between about 1.6 and about 40.

14. The method of claim 12, further comprising forming a stack of nanostructured channels in a channel region below the gate.

15. The method of claim 12, wherein forming the source/drain regions comprises:
   recessing regions of the top portion of the first fin uncovered by the gate; and
   epitaxially growing the source/drain regions in the recessed regions.

16. The method of claim 12, wherein forming the first fin comprises forming the top and bottom portions of the first fin with different materials.

17. The method of claim 12, wherein forming the first fin comprises:
   forming the bottom portion of the first fin with silicon; and
   forming the top portion of the first fin with silicon germanium (SiGe).

18. The method of claim 12, wherein forming the first fin comprises etching the bottom and top portions of the first fin using different etching operations.

19. The method of claim 12, wherein forming the first fin comprises exposing the first fin to an etchant to etch the first fin isotropically using the etching process.

20. The method of claim 19, wherein the etching process of the top portion of the first fin comprises etching the top portion at an angle formed between a top surface of the insulating material and a sidewall of the first fin, and wherein the angle is between about 60 degrees and about 90 degrees.

* * * * *